United States Patent
Mate

(10) Patent No.: US 7,696,824 B2
(45) Date of Patent: Apr. 13, 2010

(54) DIFFERENTIAL AUDIO AMPLIFIER

(75) Inventor: David Joseph Mate, Long Compton (GB)

(73) Assignee: Red Lion 49 Limited, Begbroke, Oxford (GB)

( * ) Notice: Subject to any disclaimer, the term of this patent is extended or adjusted under 35 U.S.C. 154(b) by 0 days.

(21) Appl. No.: 12/324,007

(22) Filed: Nov. 26, 2008

(65) Prior Publication Data

US 2009/0212865 A1 Aug. 27, 2009

(30) Foreign Application Priority Data

Feb. 22, 2008 (GB) ................................. 0803216.1

(51) Int. Cl.
*H03F 3/45* (2006.01)

(52) U.S. Cl. ...................... 330/258; 330/254; 330/257; 330/260

(58) Field of Classification Search ................. 330/258, 330/254, 257, 260
See application file for complete search history.

(56) References Cited

U.S. PATENT DOCUMENTS

| | | | |
|---|---|---|---|
| 3,868,583 A * | 2/1975 | Krabbe | 330/259 |
| 4,371,847 A * | 2/1983 | Biard et al. | 330/307 |
| 4,502,021 A * | 2/1985 | Hill et al. | 330/279 |
| 6,744,319 B2 * | 6/2004 | Kim | 330/254 |
| 7,215,197 B2 * | 5/2007 | Regier | 330/254 |

* cited by examiner

*Primary Examiner*—Patricia Nguyen
(74) *Attorney, Agent, or Firm*—Richard M. Goldberg

(57) ABSTRACT

A differential audio amplification apparatus with common mode rejection is shown, having a first input current path (401) and a second input current path (402) with a shunting input resistance (400) therebetween. The apparatus also has a first output current path (403) and a second output current path (404) with a shunting output resistance (405) therebetween. Differential amplifiers (412, 413) are provided with feedback connecting the input paths with the output paths and providing an output signal. The output shunting resistance (405) is controlled to provide gain control while maintaining common mode rejection.

20 Claims, 5 Drawing Sheets

DIFFERENTIAL AUDIO AMPLIFIER

CROSS REFERENCE TO RELATED APPLICATIONS

This application claims priority from United Kingdom patent application 0803216.1, filed Feb. 22, 2008, the whole contents of which are incorporated herein by reference in their entirety.

TECHNICAL FIELD

The present invention relates to a differential audio amplification apparatus with common mode rejection and a method of amplifying a differential input signal.

BACKGROUND OF THE INVENTION

Differential amplifiers are used in high quality microphone amplifiers, many of which are required to meet the requirements of professional broadcasters. To provide common mode rejection, it is known to use microphone amplifiers that include transformers for coupling the microphone output to the amplifying electronics. However the frequency response of transformers is not particularly good therefore there has been a tendency to move away from this solution and to make use of differential balanced amplifiers.

A known approach includes the use of two amplifier paths followed by a precision subtracter. The idea of this approach is that any signal that is common to the amplifier paths gets removed in the subtracter. However, this presents a problem in that the amplifier does pass the common mode signal therefore the voltage to be developed becomes that of the differential voltage plus the common mode voltage. Thus, if such an amplifier is to provide sufficient gain to be useful, it is likely that the peak voltage required due to the presence of the common mode signal will be relatively large compared to that provided by conventional supply rails.

An alternative approach is to provide a limiter so that it is possible to turn down the gain at the front end when large signals are present. However, such an approach impacts upon the dynamic range in that the original dynamic range will require a reserve thereby adversely affecting the overall performance. Furthermore, it is not practicable to make electronic variable resistances accurate enough to be used for controlling the known front end input.

BRIEF SUMMARY OF THE INVENTION

According to an aspect of the present invention, there is provided a differential audio amplification apparatus with common mode rejection. The apparatus comprises a first input current path and a second input current path with a shunting input resistance therebetween. A first output current path and a second output current path with a shunting output resistance therebetween are provided and differential amplifiers with feedback connecting the input paths with the output paths and providing an output signal. The output shunting resistance includes a controllable resistance circuit and is controlled to provide gain control while maintaining common mode rejection.

DESCRIPTION OF THE BEST MODE FOR CARRYING OUT THE INVENTION

FIG. 1

Figure 1:
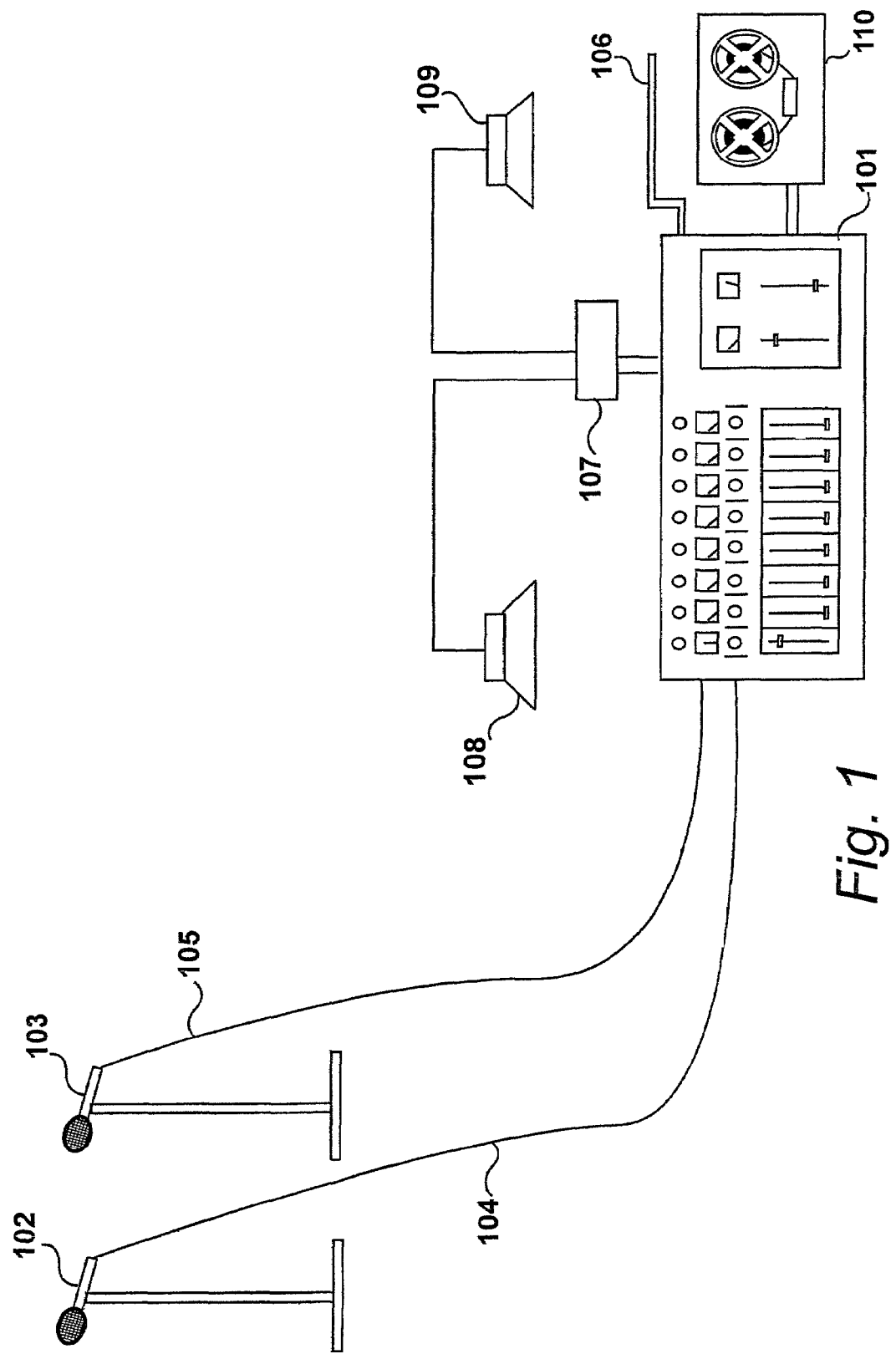
FIG. 1 shows a broadcast environment in which audio signals are produced.

A broadcast environment is illustrated in FIG. 1 in which audio signals are received at a mixing console 101. In this example, audio signals are being generated by a first microphone 102 and a second microphone 103. An input cable 104 feeds a first input signal to the mixing console 101 and a second cable 105 supplies the second audio signal to the mixing console 101. An output from the mixing console 101 supplies a mixed signal to a broadcast feed 106 and a monitoring amplifier 107 supplies an amplified signal to local loudspeakers 108 and 109. In addition, it is possible for the mixed audio signals to be recorded by an audio recorder 110.

The mixing console 101 includes input stage amplification for each of the differential input signals received on cables 104 and 105. It is envisaged that cables 104 and 105 will be passed through a relatively noisy environment and as such will tend to induce noise signals that may be substantially higher than the input signals generated by their respective microphones. Cables of this type are also used for other audio generating instruments where signals are conveyed at microphone level over balanced cables. A mixing console 101 is illustrated in FIG. 1 but the input stage differential amplifier could also be provided within a self contained audio processing system (such as a one unit rack mount device) or a self contained recording system etc.

FIG. 2

Figure 2:
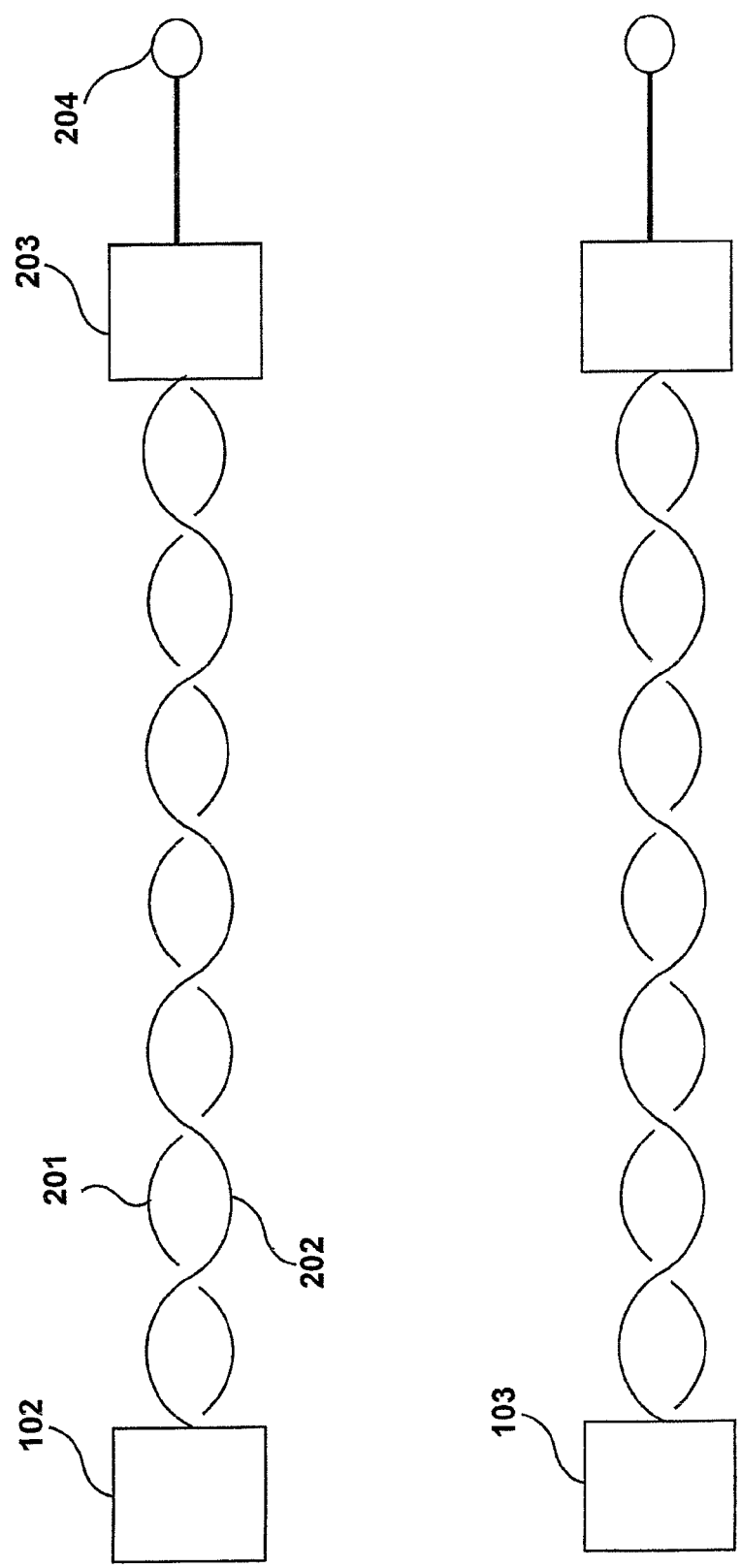
FIG. 2 shows a diagrammatic representation of the environment of FIG. 1, including a differential amplifier.

A diagrammatic representation of the environment of FIG. 1 is illustrated in FIG. 2. Audio signal generators (the microphones) are illustrated at 102 and 103. A differential output is produced from each such that the transmission cable (104 for example) actually consists of a twisted pair of conductors 201, 202. Thus, each communication channel consists of a first part of a differential signal, conveyed on line 201 and a second part of a differential signal conveyed on line 202. A differential input stage is illustrated at 203 which in turn provides an output at 204 for subsequent processing and amplification etc.

FIG. 3

Figure 3:
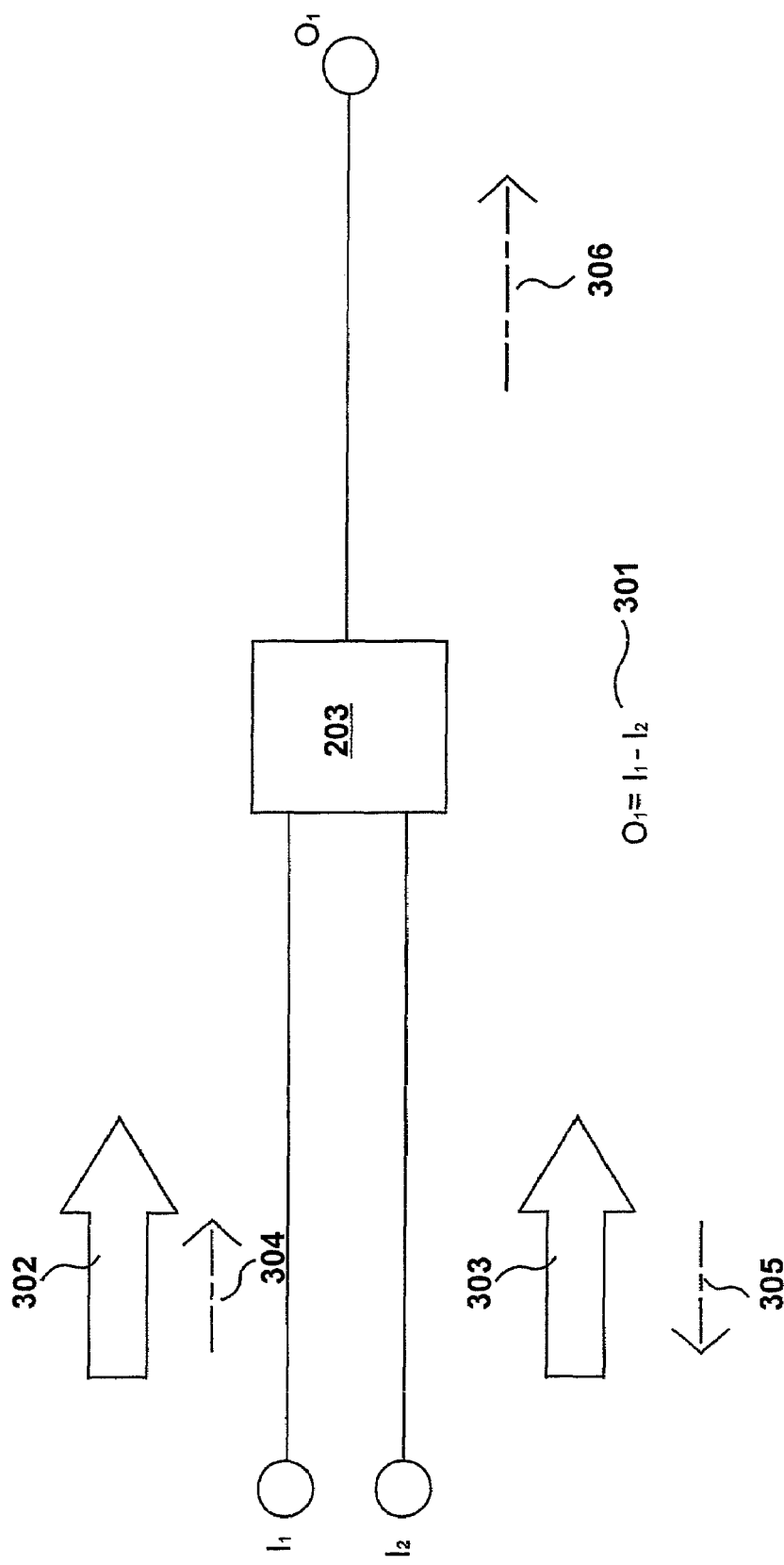
FIG. 3 illustrates operations performed by the differential amplifier of FIG. 2.

Differential amplifier 203 is illustrated schematically in FIG. 3. The first part of the differential input signal is illustrated as $I_1$ and the second part of the differential input signal is identified as $I_2$. As shown at 301, the resulting output $O_1$ is equal to $I_1-I_2$.

In the example shown, the cables conveying the differential signal have been introduced to a noisy environment. This has resulted in large signals being induced within the conductors represented by a first large arrow 302 having a positive sense and a second large arrow 303 again having a positive sense. These represent relatively large voltages which under non-balanced conditions would result in very large noise signals being amplified making it impossible to amplify the signals of interest.

In the example of FIG. 3, signals of interest are represented by a third arrow 304 having a positive sense and a fourth arrow 305 having a negative sense. Thus, the voltage on $I_1$ is equal in value to the voltage on $I_2$ but in the opposite sense. However, at the differential amplifier 203 the voltage on $I_2$ is subtracted from the voltage on $I_1$. Consequently, voltages 302 and 303 cancel out whereas voltages 304 and 305 are combined. As a result, a strong output voltage, defined from the differential signal and represented by arrow 306 is generated whereas the large noise-induced voltages, being of equal value and of equal sense, cancel out such that their influence is removed before any further amplification or signal processing is conducted. For example, in many applications after performing differential amplification of this type, the signal would be supplied to an analog to digital converter for subsequent processing in the digital domain.

FIG. 4

Figure 4:
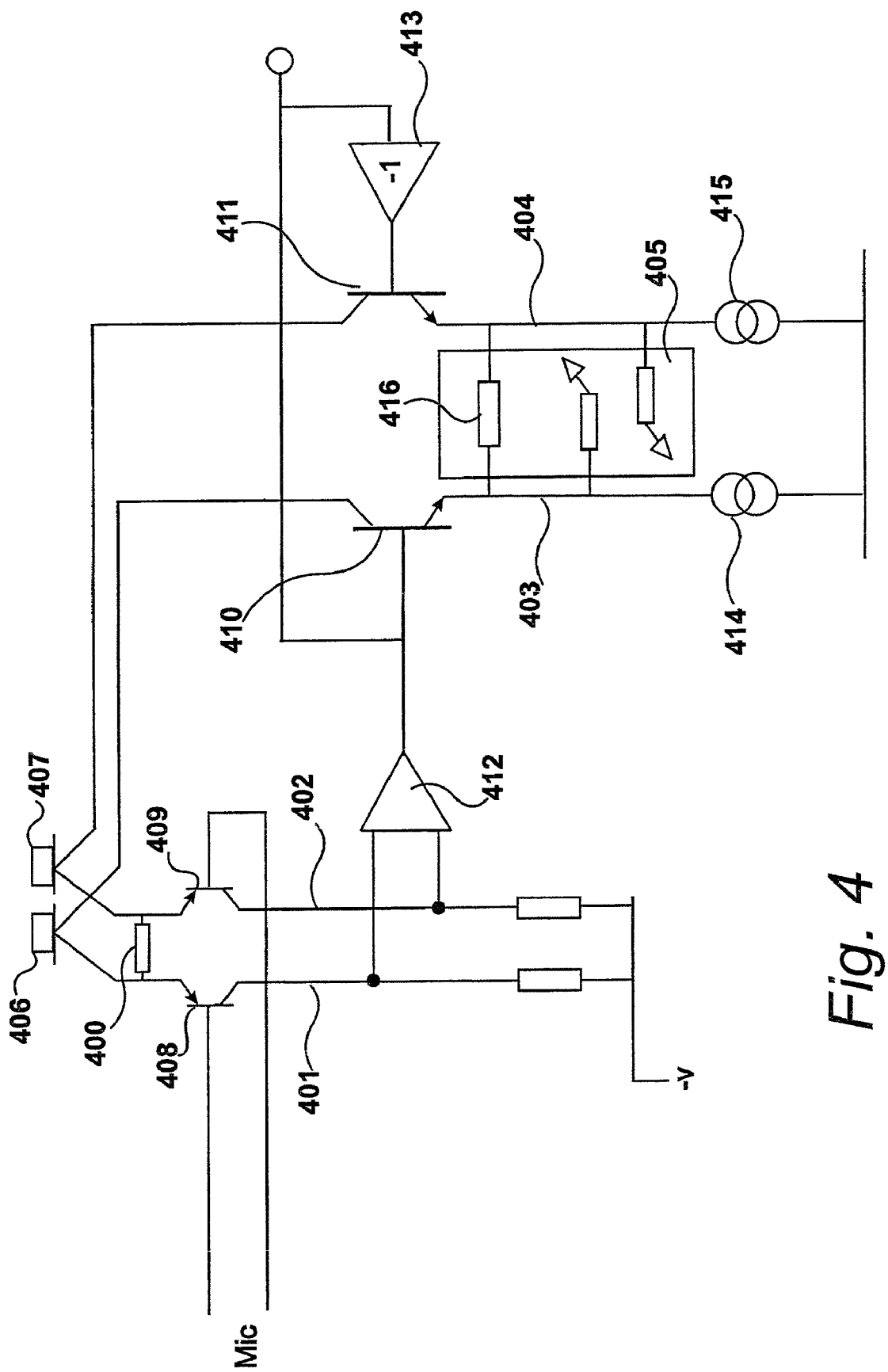
FIG. 4 shows a preferred implementation of the differential audio amplification apparatus.

A preferred implementation of the differential audio amplification apparatus is illustrated in FIG. 4. A first input current path 401 is provided along with a second input current path 402. A shunting input resistance 400 is placed between input current path 401 and input path 402.

A first output current path 403 is provided with a second output current path 404. A shunting output resistance is placed between the first output current path 403 and the second output current path 404. The output shunting resistance 405 is controlled to provide gain control while maintaining common mode rejection.

In a preferred embodiment, the first input current path 401 and the first output current path 403 are connected via a first current mirror 406. Similarly, the second input current path 402 and the second output current path 404 are connected via a second current mirror 407. As is known in the art, a current mirror is a circuit designed to copy a current through one active device by controlling the current in another current active device, thereby keeping the output currents constant regardless of loading.

In this preferred embodiment the first input current path 401 includes a bipolar transistor 408, the base of which receives one of the differential input signals. Similarly, the second input current path 402 includes a second bipolar transistor 409 that is substantially similar to bipolar transistor 408. Thus, the second differential input is supplied to the base of the second bipolar transistor 409.

Thus, in the preferred embodiment, the first output current path 403 includes a third bipolar transistor 410 and the second output current path 404 includes a fourth bipolar transistor 411, substantially similar to the third transistor 410. The collector of the third transistor 410 is connected to current mirror 406 and the collector of the fourth transistor 411 is connected to current mirror 407. The base of the third transistor receives a differential signal from differential amplifier (operational amplifier) 412. This differential signal is also supplied to the base of the fourth transistor 411 via an inverter 413.

Preferably, the shunting output resistance 405 is connected between the emitter of the third transistor 410 and the emitter of the fourth transistor 411.

In this embodiment, a first current source 414 is connected to the emitter of the third transistor 410 and a second current source 415 is connected to the emitter of the fourth transistor 411.

Figure 5:
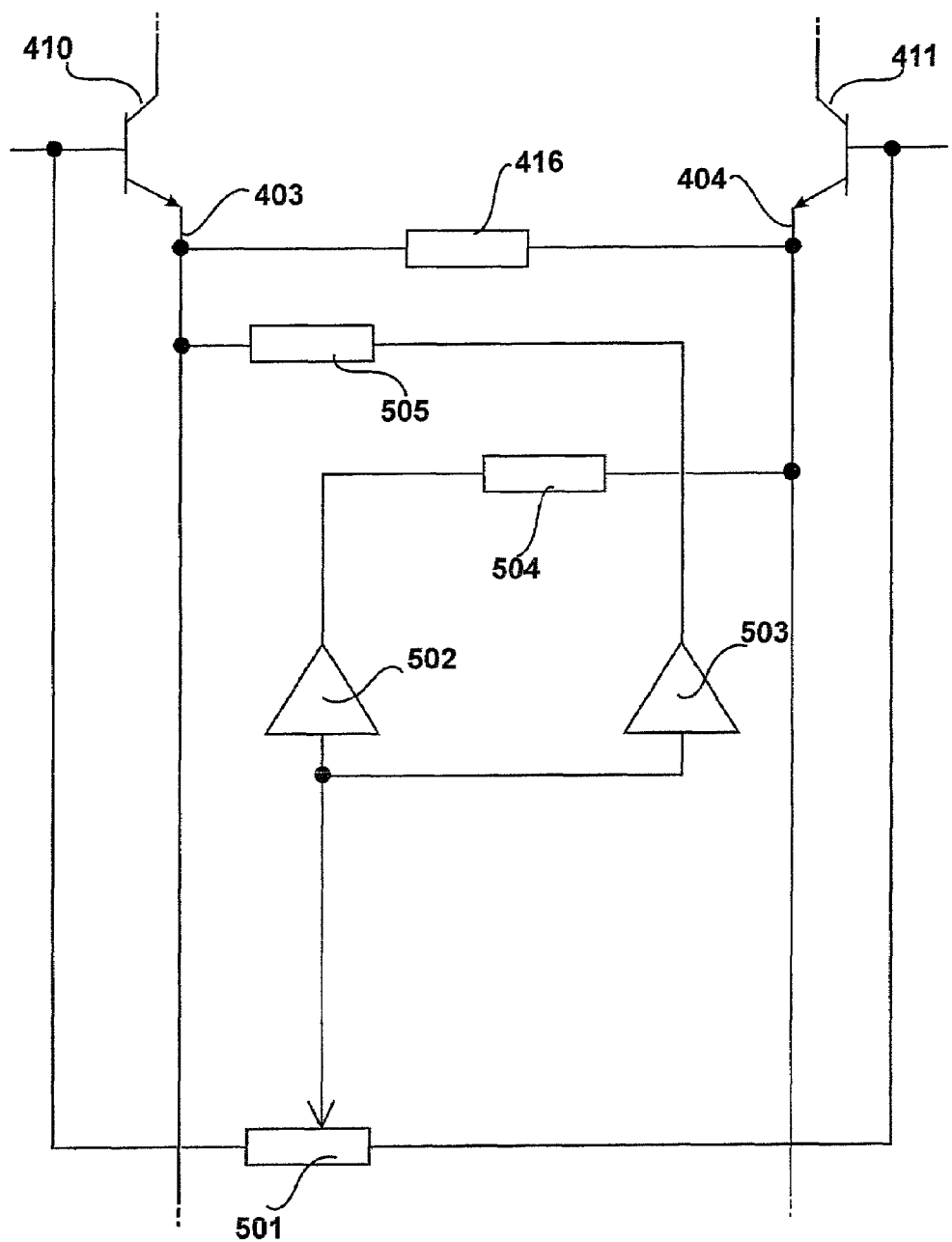
FIG. 5 illustrates variable resistance circuit 405.

The output resistance 405 includes a resistor 416 in parallel with a controllable resistance circuit, shown in greater detail in FIG. 5.

In operation, gain is controlled by controlling the controllable resistance circuit and this may be calculated by dividing the resistance in the output (feedback) portion by the resistance of the input resistance 400.

FIG. 5

Variable resistance circuit 405 is detailed in FIG. 5. This shows the third output transistor 410 and the fourth output transistor 411. Fixed shunt resistance 416 is also shown. In order to provide the variable resistance, a voltage is placed across a variable potentiometer 501 so as to provide an adjustable voltage to a first operational amplifier 502 and to a second operational amplifier 503. Consequently, amplifier 502 supplies a variable current to the second output path 404 via a load resistor 504. Similarly, a substantially similar current is supplied to the third output path 403 via a second load resistor 505.

What is claimed is:

1. Differential audio amplification apparatus with common mode rejection, comprising:
   a first input current path and a second input current path with a shunting input resistance therebetween;
   a first output current path and a second output current path with a shunting output resistance therebetween;
   differential amplifiers with feedback connecting the input paths with the output paths and providing an output signal; wherein
   said output shunting resistance includes a controllable resistance circuit and is controlled to provide gain control while maintaining common mode rejection.

2. The apparatus as claimed in claim 1, wherein a resistor is in parallel with said controllable resistance circuit.

3. The apparatus as claimed in claim 1, wherein said controllable resistance circuit includes:
   a first branch connected to an emitter of a first transistor; and
   a second branch connected to an emitter of a second transistor.

4. The apparatus as claimed in claim 3, wherein said first branch includes an amplification circuit with an input and an output.

5. The apparatus as claimed in claim 4, wherein a resistor is placed between said amplification circuit output and the emitter of the second transistor.

6. The apparatus according to claim 4, wherein said amplification circuit input receives an adjustable input.

7. The apparatus as claimed in claim 1, wherein an input stage from a microphone is connected with said first and second input current paths.

8. The apparatus as claimed in claim 1, wherein said apparatus forms an input stage to one of the following:
   a mixing console,
   an audio processing system,
   an audio recording system and
   an audio broadcast system.

9. The apparatus as claimed in claim 1, wherein:
   the first input current path and the first output current path are connected via a first current mirror; and
   the second input current path and the second output current path are connected via a second current mirror.

10. The apparatus as claimed in claim 1, wherein:
    said first input current path includes a first transistor;
    said second input current path includes a second transistor.

11. The apparatus as claimed in claim 10, wherein:

said first transistor is a bipolar transistor having an emitter, a collector and a base and a first audio input signal of a differential pair is applied to said base; and said second transistor is a bipolar transistor having an emitter, a collector and a base and a second audio input signal of said differential pair is applied to the base of said second bipolar transistor.

12. The apparatus as claimed in claim 11, wherein said shunting input resistance is connected between the emitter of the first transistor and the emitter of the second transistor.

13. The apparatus as claimed in claim 1, wherein:
the first output current path includes a first transistor and a first current source; and
the second output current path includes a second transistor and a second current source.

14. The apparatus as claimed in claim 13, wherein:
the first transistor is a bipolar transistor with a collector, base and emitter; and
the second transistor is a bipolar transistor with a collector, base and emitter.

15. The apparatus as claimed in claim 14, wherein:
the first input current path and the first output current path are connected via a first current mirror,
the second input current path and the second output current path are connected via a second current mirror, and
the collectors of said first and second transistors are connected to respective ones of said current mirrors.

16. The apparatus as claimed in claim 14, wherein the bases of said first and second transistors receive a differential signal from said first input current path and said second input current path.

17. The apparatus as claimed in claim 14, wherein the shunting output resistance is connected between the emitter of the first transistor and the emitter of the second transistor.

18. The apparatus as claimed in claim 4, wherein a first current source is connected to the emitter of the first transistor and a second current source is connected to the emitter of the second transistor.

19. A method of amplifying a differential input signal having a first part and a complementary second part, comprising the steps of:
applying a first part of a differential signal to a first input current path;
applying a second part of a differential signal to a second input current path, in which said second current path is connected to said first current path via a shunting input resistance;
supplying signals from said first and second input current paths via differential amplifiers to first and second output current paths; and
controlling the resistance of an output shunting resistance connected between the first output current path and the second output current path to provide input gain control while maintaining common mode rejection.

20. A method of providing input stage amplification for a differential input signal produced by a microphone, comprising the steps of:
applying a first part of a differential input signal to a first input current path;
applying a second part of a differential input signal to a second input current path;
supplying signals from said input current paths to a first output current path via a first operational amplifier;
supplying signals from said input current paths to a second output current path via a second operational amplifier;
connecting said first input current path to said first output current path via a first current mirror;
connecting said second input current path to said second output current path via a second current mirror; and
controlling the resistance of an output shunting resistance connected between the first output current path and the second output current path to provide input stage gain control while maintaining common mode rejection.

* * * * *